United States Patent
Burns et al.

Patent Number: 5,206,097
Date of Patent: Apr. 27, 1993

[54] BATTERY PACKAGE HAVING A COMMUNICATION WINDOW

[75] Inventors: Arthur G. Burns, Plantation; David L. Muri, Sunrise, both of Fla.

[73] Assignee: Motorola, Inc., Schaumburg, Ill.

[21] Appl. No.: 710,421

[22] Filed: Jun. 5, 1991

[51] Int. Cl.⁵ .......................................... H01M 10/48
[52] U.S. Cl. ........................................... 429/90; 429/7; 320/48
[58] Field of Search .................... 429/90–93, 429/7, 86, 123; 320/48; 340/636, 641, 653; 324/435, 450, 425

[56] References Cited

U.S. PATENT DOCUMENTS

| | | | |
|---|---|---|---|
| Re. 31,406 | 10/1983 | Gaylord | 526/279 |
| 1,497,388 | 6/1924 | Sterling | 429/91 X |
| 1,760,937 | 6/1930 | Dietrich | 429/91 |
| 3,563,806 | 2/1971 | Hruden | 429/91 X |
| 3,686,530 | 8/1972 | Bogut | 317/16 |
| 4,002,496 | 1/1977 | Nitta et al. | 429/53 |
| 4,006,396 | 2/1977 | Bogut | 320/2 |
| 4,076,906 | 2/1978 | Jensen | 429/90 |
| 4,117,205 | 9/1978 | Kitai | 429/86 |
| 4,310,606 | 1/1982 | Maida | 429/93 |
| 4,497,881 | 2/1985 | Bertolino | 429/91 |
| 4,680,527 | 7/1987 | Benenati et al. | 320/2 |
| 4,828,943 | 5/1989 | Pritchard | 429/91 |
| 5,057,383 | 10/1991 | Sokira | 429/92 |

Primary Examiner—Anthony Skapars
Attorney, Agent, or Firm—Dale W. Dorinski

[57] ABSTRACT

A battery package (100) includes a transparent window (108) which communicates information about the battery to a battery-powered device such as a portable radio (200). Information about the battery (100) is communicated through the window (108) by a series of light pulses, and is received by a light sensor (340) in the radio. The information is processed by the radio microprocessor (344) and the status of the battery (100) is displayed on the radio display (346). The window (108) is gas permeable and water impermeable, serves as a vent for the battery housing (110) and also as an optical data transmission window.

21 Claims, 4 Drawing Sheets

BATTERY PACKAGE HAVING A COMMUNICATION WINDOW

TECHNICAL FIELD

This invention relates to batteries for portable radios and other battery powered devices and more particularly to batteries having a gas vent.

BACKGROUND

A battery is coupled to a portable battery powered device to provide electrical energy to the device. Many devices use primary batteries which are single cell batteries designed to be discharged one time and then replaced. Another technology widely used is that of rechargeable batteries. These batteries are typically combinations of individual battery cells connected together in series or parallel and placed into a package. The package is fixtured such that it is easily connected and disconnected to the battery powered device, and so that it may be recharged once the electrical energy is used.

One problem inherent to battery powered devices is that the battery has a finite life and as the battery energy nears total depletion, the operation of the battery powered device becomes affected in a negative manner, eventually ceasing to operate. At this point, the battery is typically recharged by removing the battery from the device and placing it in a battery charger. In order to properly charge the battery, the charger must deliver the correct amount of current to the battery over a period of time. If the charger delivers too little current, the battery may not become fully charged. Conversely, if the charger delivers too much current, the battery will become overcharged, overheated, and damaged. Many rechargeable battery packages have some means of sensing the degree of charge of the battery during this operation. This is accomplished by such items as thermistors (for battery temperature measurement) and coding resistors (whose value can identify the proper charge rate and control method). The sensing circuitry can also be used to communicate the condition of the battery to the battery powered device.

U.S. Pat. No. 4,680,527 describes an electrical battery with a current sensing system used to monitor the magnitude of current drawn from the battery during operation. In one embodiment, a total of eight contacts are present on the battery. The contacts and associated interconnection increase the complexity of the battery. Each contact requires a penetration through the housing wall and, thus, is a potential source of moisture intrusion.

In addition, a vent must be provided in the battery housing in order to equalize atmospheric pressure changes to prevent the otherwise waterproof, airtight, sealed housing from "ballooning" and to allow any cell vented gasses (hydrogen, oxygen) from accumulating which could result in an explosion hazard. Vents have two major functions: waterproofing and gas permeability. These vents have been made from a number of materials such as sintered metal, one-way flapper valves, and breathable material such as GORE-TEX ®. Adding such a vent requires an additional hole in the housing and adds an additional cost and manufacturing step to the battery package.

It would also be highly desirable to be able to monitor other functions and parameters of the battery, such as the number of charge/discharge cycles, the capacity rating of the battery, temperature of the battery, the amount of capacity remaining in the battery, the type of battery chemistry, and so forth. In order to communicate each of these parameters to a charger or battery powered device using existing technology, each parameter would require an individual contact in the housing. It may be easily seen that the number of contacts in a housing quickly rises to an unmanageable number if one were to monitor all functions of the battery. If one desires to limit the number of contacts and electrically multiplex on a few lines within the radio and battery, spurious signals could readily result and interfere with the radio operation.

Clearly, an improvement is needed that will provide for a method of monitoring many of these battery parameters while, at the same time, communicating them to a charger or a battery powered device. In addition, a method of venting the battery that does not require an additional vent hole is also desirable.

SUMMARY OF THE INVENTION

Briefly, according to the invention, there is provided a battery package comprising a housing with a transparent window. An energy storage device is contained within the housing and a communications means transmits information through the transparent window.

In a further aspect of the invention, the transparent window is a gas permeable membrane that also functions as a window for communicating information by a light signal. The window acts as a vent to allow the interior of the battery housing to be maintained at the same pressure as the exterior environment.

In still another aspect of the invention, the battery package and a battery powered device such as a radio are coupled together. The battery communicates information to a portable radio via a light signal through a window in the battery housing. The operation of the radio may be modified based on information transmitted from the battery.

DETAILED DESCRIPTION OF THE PREFERRED EMBODIMENT

Figure 1:
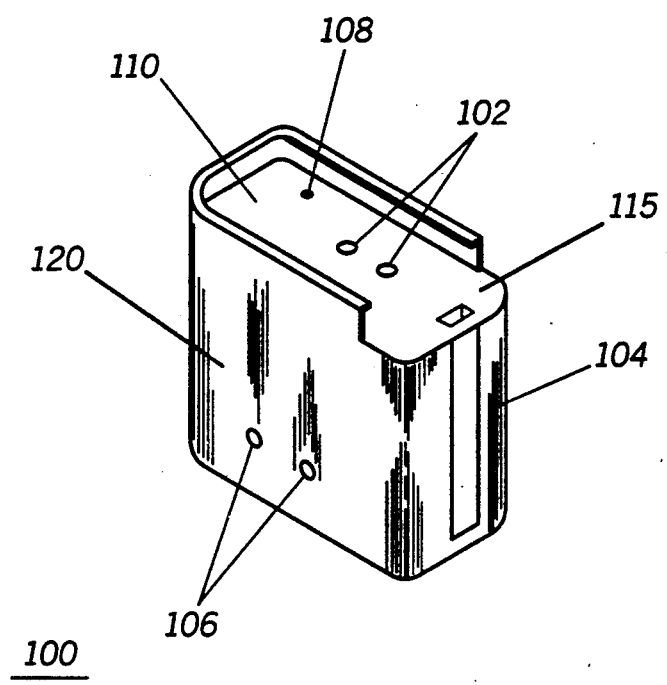
FIG. 1 is an isometric view of a battery package in accordance with the invention.
Figure 2:
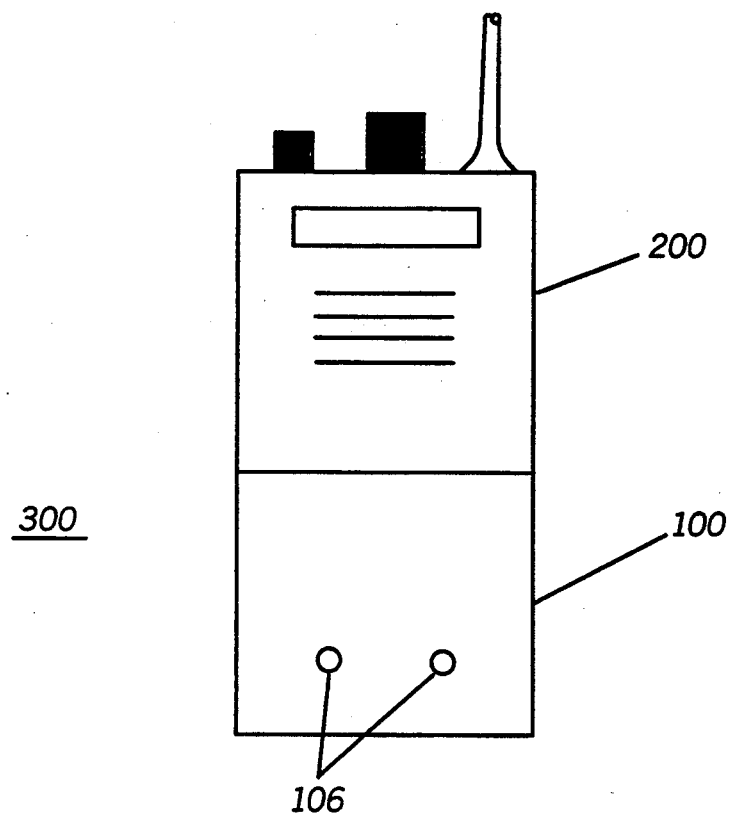
FIG. 2 is an elevational view of the battery coupled to a portable radio.
Figure 3:
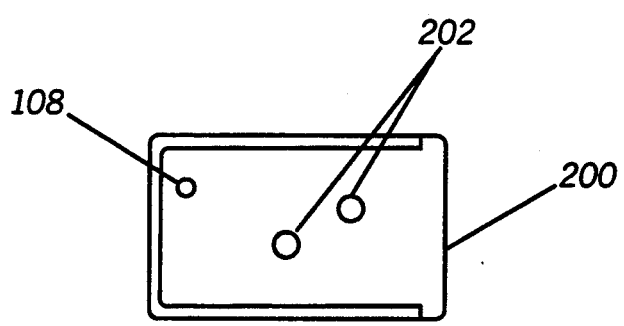
FIG. 3 is a bottom view of the radio, showing the electrical contacts.

Referring now to FIG. 1, a perspective view of one embodiment of a battery in accordance with the present invention is shown. Battery 100 includes a housing 110 made of a material having a substantial structural integrity such as polycarbonate, for example, which is sufficiently durable to protect battery cells which are housed therein. Battery housing 110 includes an external surfaces 115 and 120 on which electrical contacts 102 and 106 are situated. Contacts 102 are electrical contacts which permit the battery to interface with and couple to a battery powered device (not shown). Contacts 106 are electrical contacts which permit the battery to interface and couple to a battery charger (not shown). An example of a battery powered device that is connectable to battery 100 is shown in FIG. 2. In this instance, the battery powered device 200 is a portable radio. FIG. 3 shows a bottom view of the electrical contacts of portable radio 200. Electrical contacts 202 are configured so as to mate with and couple to the electrical contacts 102 of the battery. Although the term radio or portable radio is employed throughout this text, those skilled in the art will realize that these contacts are usable to couple battery 100 to any power consuming device in addition to portable radios. In this invention, particularly applicable to portable radios and rechargeable batteries, contacts 102 and 202 couple the battery to the radio and contacts 106 couple the battery to a battery charger.

Referring back to FIG. 1, the battery housing 110 contains a communication port 108 in one of the exterior surfaces 120. The communications port or multifunctional window serves as a port to provide information about the battery type, the battery capacity, the state of charge of the battery, the number of charge/discharge cycles, the temperature of the battery, the size of the battery and other parameters. Communications ports 108 also serves as a vent to release excess pressure from the interior of the housing 110. If excess pressure is generated during the charge/discharge cycle, gas is vented from the battery cells. For sealed, watertight batteries, pressure differentials between the interior of the housing 110 and the ambient atmosphere are also experienced when, for example, batteries are taken in airplanes or to higher mountain altitudes, and also upon returning to ambient. It is important to equalize the pressure inside the housing with that of the ambient environment in order to prevent the housing from bowing or collapsing.

In order to provide a communication port 108 that serves as both a vent and a communications port for optical data transmission, a window material should be permeable to gas, transparent to light, and impermeable to water and other fluids. It is often desirable, for example, to seal the battery housing against intrusion from moisture. Materials useful as a combination vent and communications port are silicone polymers, polytetrafluoroethylene films (TEFLON ®), and materials used in the manufacture of gas permeable contact lenses. These lenses are typically acrylic ester polymers and copolymers. For further information and detail in the chemistry of the contact lens material copolymers, the reader is referred to U.S. Pat. Nos. 4,652,622 and 4,355,147 by Deichert et al. and U.S. Pat. No. Re. 31,406 by Gaylord. These patents are incorporated herein by reference. These materials may be cast into a rigid form and machined into the desired configuration, and have higher gas permeability in comparison to conventional contact less materials. For example, a copolymer comprising thirty-five parts pentamethyldisiloxanlmethyl methacrylate and sixty-five parts methyl methacrylate has an oxygen permeability of 500 cc-mil/100 sq.in/24 hrs/atmosphere compared to an oxygen permeability of about thirty-four (34) for polymethylmethacrylate and thirteen (13) for polyhydroxlmethacrylate. By modifying the chemistry of the copolymers, oxygen permeability values as high as seven hundred sixty-five (765) may be obtained. These values are within the range to be useful as gas vents for battery housing.

Since the communications port 108 is optically transparent to light, a non-contact communication may be made between the battery 100 and battery powered device 200. This eliminates the need for an additional electrical contact and a difficult-to-seal contact in the housing. Optical communications may be made by the use of a simple emitter such as a light emitting diode (LED) in the battery 100 and a photodiode sensor in the radio 200. Multiplexing the light signals through a single port provides the advantage of communicating a great deal of information while only making a single opening in the housing. In the prior art, many connections and openings are required to communicate the same amount of information, typically one for each piece of information. Other types of light signals may be used that operate outside the visible spectrum, for example, infrared transmitters and sensors or ultraviolet transmitters and sensors.

Figure 4:
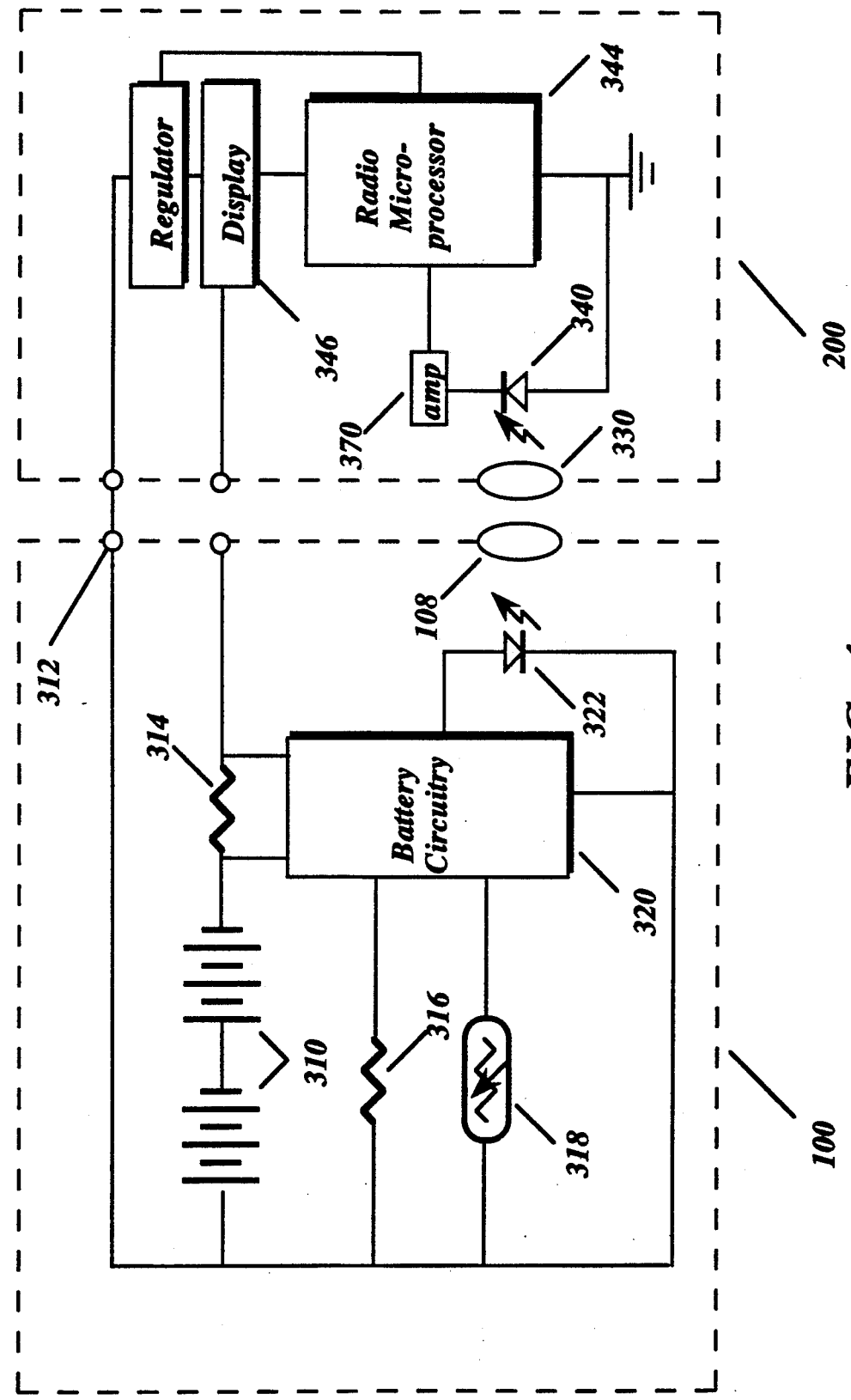
FIG. 4 is an electrical schematic of the battery and radio circuitry.
Figure 5:
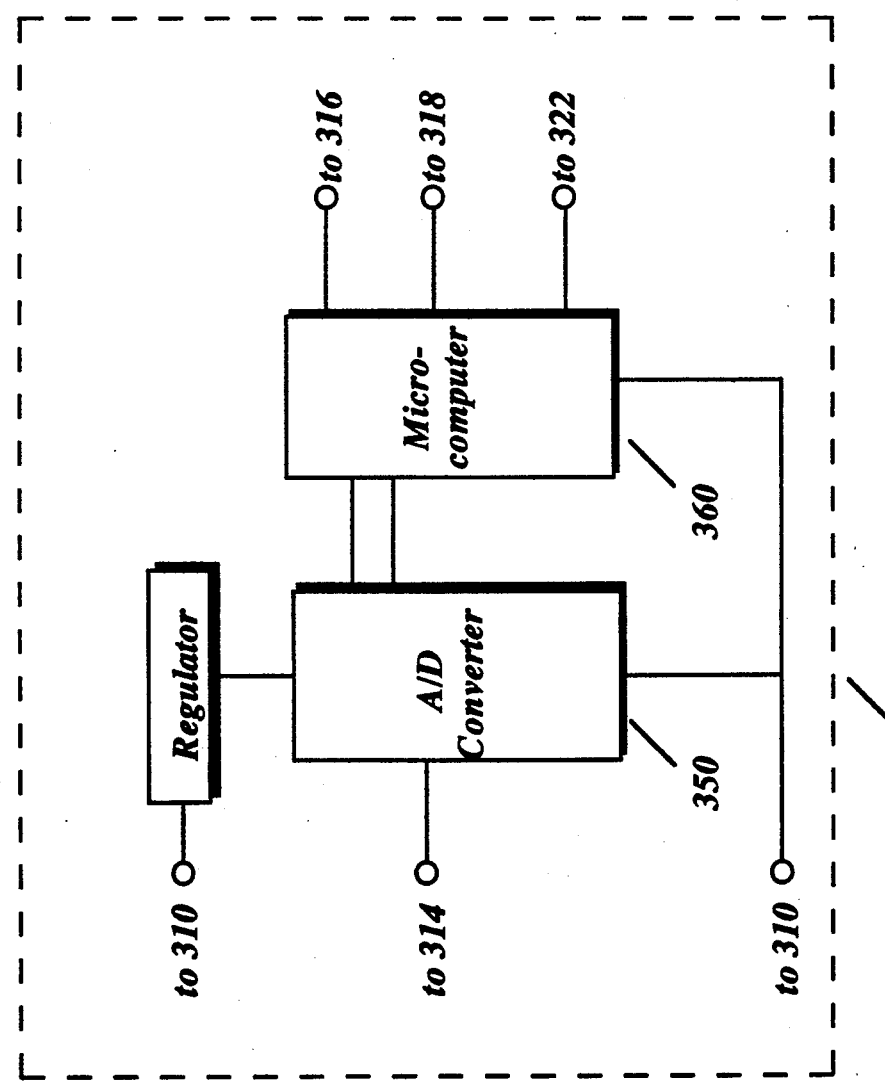
FIG. 5 is an electrical schematic showing details of the schematic of FIG. 4.

Referring now to FIG. 4, battery 100 contains one or more battery cells 310 connected either in series, parallel, or a combination of series and parallel. The cell or battery is mated with an electrical connection 312 and also is coupled to a variety of circuitry such as sensing resistors 314, coding resistor 316, thermister 318 (used to measure temperature), and additional battery circuitry used to encode the information obtained from the sensors. The encoded information is transmitted in the form of digital or analog light signals via a transmit LED 322 through the multifunction window 108. The light pulses transmitted through window 108 are received by a photodetector 340 mounted in the battery powered device or radio. A multifunction window 330 may be used if the radio requires weather tight sealing or the receive photodetector 340 may be mounted in the radio case. The receive photodetector 340 typically consists of a photodiode. The signal received from the photodiode is fed into the radio microprocessor 344 and the microprocesser output is displayed on the radio display 346. Examples of battery parameters that may be communicated to the radio are: battery voltage, battery temperature, battery type, battery capacity remaining, the immediate current in the battery, the number of charge/discharge cycles, and information on faulty conditions resident in the battery. This information may also be displayed easily on the radio display. Referring now to FIG. 5, a more detailed electrical schematic of the battery shows the makeup of the battery circuitry 320. An analog-to-digital converter 350 converts the analog signals obtained from the sensors. The digital signal is fed into a controller 360 that modulates the signal, producing a signal that is a series of electrical pulses. In FIG. 4, the signal is fed to the LED 322 which converts the electrical pulses into light pulses and which are transmitted through the multifunction window 108. After the light signals are received by the receiving photodiode 340 in the radio, they are amplified by an amplifier 370 and the data is converted into useful information by the radio microprocessor 344 and communicated to the radio display 346.

The advantage of using the above methodology in a battery-radio hookup is that the microprocessor necessary to manipulate the data and convert it into a useful signal is placed in the radio. Typically, this microprocessor already exists in radios and simply requires additional programming to monitor and convert these signals into useful information. By utilizing the radio microprocessor 344, an additional microprocessor is not needed in the battery. This is very important because each portable radio may have several batteries that are used from time to time with the radio, depending upon battery size and the state of charge of the battery. By utilizing the microprocessor in the radio, the manufacturing cost and complexity of the battery is reduced significantly.

The information is converted into data words and transmitted from the battery to the radio in pulses. One data word is transmitted approximately every second. The LED is on approximately three tenths of a percent (0.3%) of the time. Assuming a ten milliampere peak LED current, this yields an average thirty microampere current which equals about 0.72 milliampere hours per day. For reliability and cost factors, the protocol used between the battery monitoring process and the radio microprocessor or the host processor needs to be as simple as possible. By providing a protocol that has very loose timing specifications, complex equipment and high processor loading can be avoided. In an example of a typical protocol, the messages transmitted from the battery are composed of two parts: a command and an argument field. There are six possible commands, each with its own argument. The simplest protocol is to send a number of pulses indicating the command and, after a brief amount of time, approximately two milliseconds, another set of pulses for the argument. Battery status is updated every few seconds and commands are transmitted any time the radio is turned on.

|  | Command | Argument | Information |
|---|---|---|---|
| Battery Voltage | 1 Pulse | 1-8 Pulses | 6-8 Volts |
| Current | 2 Pulses | 1-8 Pulses | 20 ma - 3 amps Log scale |
| Present Battery Capacity | 3 Pulses | 1-8 Pulses | <20%, 40%, 60'%, 80%, 100% |
| Max. Battery Capacity | 4 Pulses | 1-8 Pulses | Defined Battery Sizes |
| Battery Technology | 5 Pulses | 1-8 Pulses | Defined Battery Types |
| Battery Problem | 6 Pulses | 1-8 Pulses | Shorted Cell, Over/Under temp. |
| Battery Temperature | 7 Pulses | 1-8 Pulses | Battery temperature indicator |
| Battery Cycle Counter | 8 Pulses | 1-8 Pulses | Charge/Discharge cycle counter |

In another embodiment of the invention, the battery may also communicate information to a battery charger via a similar communications port. The circuitry and sensors in the battery to communicate information to the charger are similar to those used to communicate information to the radio and the circuitry in the charger is similar to that utilized in the radio. Typically, a second set of contacts is used to charge the battery and a second communications port would also be used. During the charging cycle, the charger queries the battery as to the status of the battery cells and applies the appropriate amount of current and voltage in order to properly charge the battery to one hundred percent completion. Typical schemes employed in the prior art utilize simple methods such as measuring the battery temperature or voltage in order to determine when the battery is fully charged. By monitoring a number of factors in the battery, the battery can be more effectively charged. While the preferred embodiment provides unidirectional communication from the battery, if desired, the communication could be bidirectional allowing the radio or battery charger to transmit data and/or commands to the battery. In that case, light emitters and sensors would be provided in both units.

The examples shown in the figures, while illustrative, are not meant to be considered limiting and other configurations of the invention may be envisioned to fall within the scope of the invention.

What is claimed is:

1. A battery package, for providing non-contact communications between the battery package and a battery powered device, comprising:
   a housing having a transparent window;
   at least two energy storage devices contained within the housing;
   electronic means, coupled to the energy storage devices, for generating a signal containing information about the energy storage devices; and
   communicating means, coupled to the electronic means, for communicating the signal to the battery powered device through the transparent window, comprising an optical transmitter.

2. The battery package of claim 1, wherein the transparent window is gas permeable.

3. The battery package of claim 1, wherein the transparent window is gas permeable and liquid impermeable.

4. The battery package of claim 1, wherein the transparent window comprises polytetrafluoroethylene film, glass frit, or oxygen permeable contact lens materials.

5. The battery package of claim 1, wherein the energy storage device comprises a battery cell.

6. The battery package of claim 1, further comprising a receiving means, coupled to the electronic means, for receiving a signal through the transparent window from the battery powered device.

7. The battery package of claim 6, wherein the communicating means comprises a light emitter coupled to the sensing means.

8. The battery package of claim 7, wherein the communicating means further comprises a light sensor for receiving a light signal from an energy consuming or energy supplying device through the window.

9. A battery charging system, comprising:
   A) a battery package adapted for interconnection to a battery charger, comprising:
      a housing having a window and electrical terminals;
      at least one energy storage device situated in the housing and coupled to the electrical terminals; and
      a first means for communicating information through the window.
   B) a battery charger, comprising:
      a charger housing having electrical terminals;
      a second means for communicating information, coupled to a means for analyzing the information; and
      means, coupled to the analyzing means, for modifying the operation of the charger as a function of the information;
   C) means for connecting the electrical terminals of the battery and charger; and
   D) means for coupling the first communicating means and the second communicating means.

10. The battery charging system as described in claim 9, wherein modifying the operation of the charger comprises communicating the battery information to a user of the charger.

11. The battery charging system as described in claim 9, wherein the window transmits light and is gas permeable.

12. The battery charging system as described in claim 9, wherein the window comprises a vent.

13. The battery charging system as described in claim 9, further comprising a battery powered device coupled to the battery.

14. A battery monitoring system for use in a portable radio, comprising:
  A) a battery package adapted for interconnection to the radio, comprising:
    a battery housing having a window and electrical terminals in at least one of the housing external surfaces;
    at least one battery cell situated in the housing and coupled to the electrical terminals;
    a light emitter situated within the housing so as to transmit a light signal through the window to the radio, the signal containing information about the battery; and
    means, coupled to the light emitter and contained within the housing, for sensing the condition of the battery cell;
  B) a radio, comprising:
    a radio housing having electrical terminals in at least one of the housing external surfaces;
    a light sensor coupled to a means for analyzing the light signal; and
    means, coupled to the analyzing means, for modifying the operation of the radio as a function of the transmitted information;
  C) means for coupling the battery package to the radio;
  D) means for connecting the electrical terminals of the battery package and radio; and
  E) means for coupling the light emitter and the light sensor.

15. The battery monitoring system as described in claim 14, wherein modifying the operation of the radio comprises communicating the battery condition to a user of the radio.

16. The battery monitoring system as described in claim 14, wherein the window transmits light and is gas permeable.

17. The battery monitoring system as described in claim 16, wherein the window comprises a vent.

18. The battery monitoring system as described in claim 17, wherein the battery package further comprises a light sensor situated so as to receive a light signal from the radio.

19. The battery monitoring system as described in claim 14, wherein the radio further comprises a feedback means, coupled to a light emitter situated so as to transmit a light signal to the battery, for sending information on the state of the radio to the battery via the light signal.

20. A battery package, for use with a battery powered device, comprising:
  a housing having a transparent window, the window being gaspermeable and serving as a vent for the battery package;
  at least two energy storage devices contained within the housing;
  electronic means, coupled to the energy storage devices, for generating a digital signal containing information about the status of the energy storage devices; and
  optical transmitting means, coupled to the electronic means, for transmitting the signal to the battery powered device through the transparent window, comprising a light emitting diode.

21. The battery package of claim 20, further comprising an optical receiving means, coupled to the electronic means, for receiving a digital signal from the battery powered device.

* * * * *